United States Patent [19]

Nishioka et al.

[11] Patent Number: 5,220,613
[45] Date of Patent: Jun. 15, 1993

[54] AUDIO AMPLIFIER CIRCUIT

[75] Inventors: Kei Nishioka; Chung Chien San, both of Kyoto, Japan

[73] Assignee: Rohm Co., Ltd., Kyoto, Japan

[21] Appl. No.: 735,912

[22] Filed: Jul. 25, 1991

[30] Foreign Application Priority Data

Jul. 30, 1990 [JP] Japan .................. 2-201706

[51] Int. Cl.⁵ .................. H03G 3/00; H04B 1/10
[52] U.S. Cl. .................. 381/104; 381/108; 455/222
[58] Field of Search .................. 381/94, 104, 107, 108, 381/110; 455/219, 220, 221, 222, 223, 224

[56] References Cited

U.S. PATENT DOCUMENTS 3,896,272  7/1975  Takahashi et al. .................. 381/19
4,041,408  8/1977  Trotnick, Jr. .................. 381/104
4,398,060  8/1983  Ienaka et al. .................. 381/4

Primary Examiner—James L. Dwyer
Assistant Examiner—Jack Chiang
Attorney, Agent, or Firm—Fay, Sharpe, Beall, Fagan, Minnich & McKee

[57] ABSTRACT

An audio amplifier circuit according to the present invention features an arrangement of a power line with a smoothing capacitor inserted as a power filter and a power line without such a smoothing capacitor. The audio amplifier circuit in which an input stage amplifier of a main amplifier is supplied with power via the former power line has a muting circuit for rapidly charging a negative feedback capacitor for generating negative feedback voltage to be fed back from the following stage of the main amplifier to the input stage amplifier up to a voltage level at which a pop sound is inhibited when the power is supplied and for rapidly discharging the negative feedback capacitor up to a reference operating voltage level when the voltage of the former power line with the smoothing capacitor exceeds a predetermined level, the voltage of the former power line being monitored after the power is supplied from a power supply. In this way, the negative feedback capacitor connected to the input stage amplifier of the main amplifier is caused to perform a muting operation by rapidly charging the capacitor up to a level higher than a pop sound level. A point of time the muting operation terminates is determined by a point of time the negative feedback capacitor is caused to start to discharge itself by rapidly discharging the charge of the negative feedback capacitor.

12 Claims, 2 Drawing Sheets

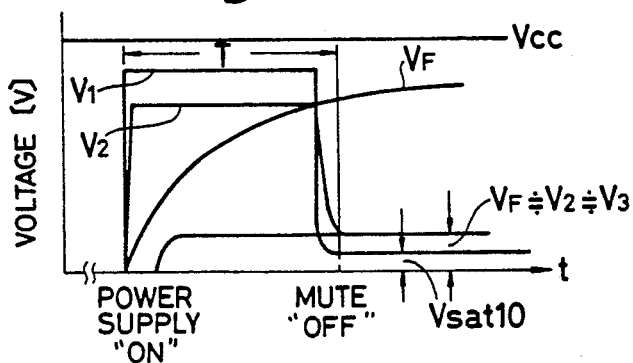
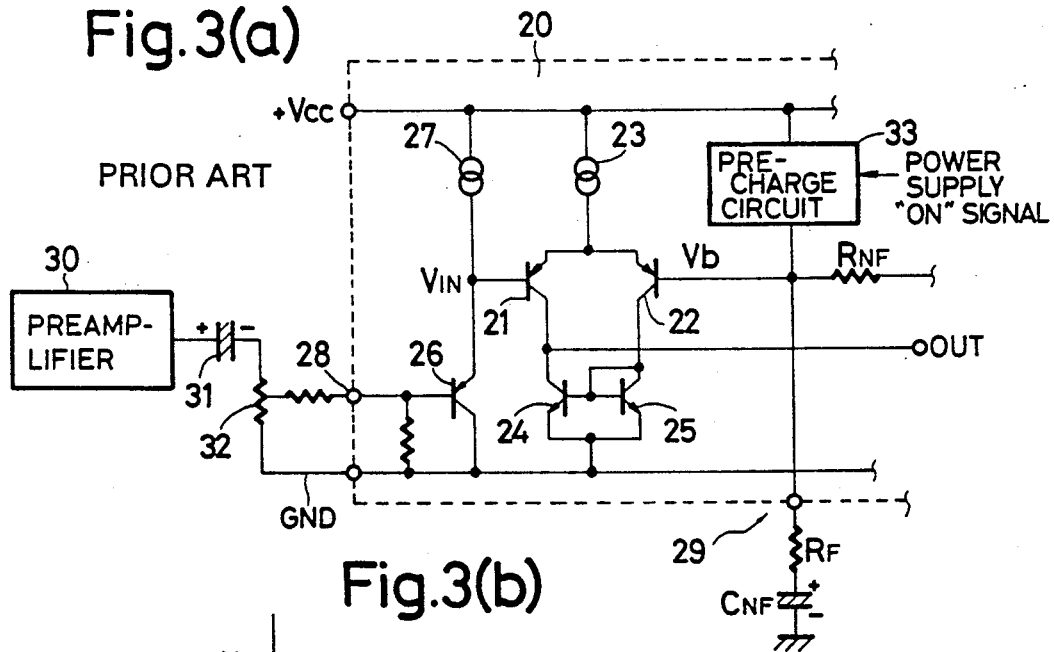
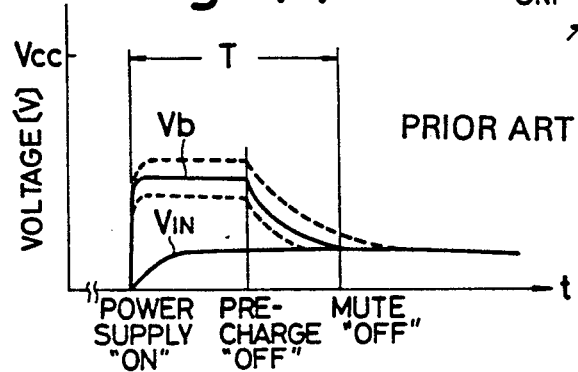

AUDIO AMPLIFIER CIRCUIT

BACKGROUND OF THE INVENTION

1. Technical Field

The present invention relates to an audio amplifier circuit and more particularly to an improved muting circuit capable of arresting a pop sound and suppressing various noises deriving from a speaker when a power supply of audio equipment is turned on, and making constant the mute time fluctuating in response to the fluctuation of supply voltage, irrespective of the fluctuation thereof.

2. Description of the Prior Art

In audio equipment represented by car stereos, mini-component stereos, CD radio cassette recorders and the like, the recent trend is for their circuitry to become increasingly integrated, such circuitry including amplifier circuits such as preamplifiers and main amplifiers, and additional circuits such as muting circuits accompanying those preceding ones, and peripheral circuits, as well as AM and FM receiving circuits. Simultaneously with the integration of these various circuits in progress, attempts have also been made to develop the audio amplifier circuit to be integrated in one chip and to digitize it further.

The amplifier circuit fit for use in audio equipment and simultaneously for integration is a direct-coupled amplifier circuit whose power supply circuit supplies, when it is turned on, constant voltage power at various levels to those different circuits stated above. When the power is thus supplied, every circuit is actuated. However, as a transition shock pulse appears at the time the power is supplied, a pop sound is caused to be heard from a speaker. Many people find the pop sound flowing from the speaker to be offensive. This has posed a problem for such audio equipment. Consequently, a muting circuit is operated in conjunction with the on-/off timing of the power supply to arrest the sound, the circuit being contrived so as to prevent the pop sound from being produced at the time the power supply is turned on/off.

Incidentally, some audio equipment is often provided with a stand-by switch function as one of its functions, so that while the supply voltage is normally being applied to each circuit, each circuit is caused to operate by supplying power thereto from a power line whenever the stand-by switch is turned on (this is often made an operational power on/off switch). The pop sound is produced from audio equipment of this sort.

FIG. 3(a) shows a conventional muting circuit for placing an audio amplifier circuit in a mute state by utilizing a low-pass filter for feeding a negative feedback signal from the output stage of a main amplifier to the input stage thereof. FIG. 3(b) shows a waveform chart illustrating the operating timing.

In the main amplifier of an audio amplifier circuit reduced to an IC form, a differential amplifier circuit is generally employed at the input stage thereof. FIG. 3(a) shows a differential amplifier circuit 20 as an example of the amplifier circuit of this sort. The differential amplifier circuit 20 comprises PNP bipolar transistors (hereinafter called 'transistors') 21, 22 for differential amplification, and a constant current source 23 located on their upstream side. On the other hand, NPN transistors 24, 25 as current mirror loads connected to the respective collectors of the transistors 21, 22 are provided on their downstream sides.

The base of the transistor 21 receives an input signal via an NPN transistor 26. The emitter of the transistor 26 is connected to a power line +Vcc via a constant current source 27 located on the upstream side of the emitter. The emitter output of the transistor 26 is applied to the base of the transistor 21 and its collector is grounded, whereas its base is connected to an input terminal 28. The input terminal 28 receives the input signal from a preamplifier 30 via a volume control 32 and a capacitor 31, so that the input signal becomes what is applied to the transistor 26.

The output of the differential amplifier circuit 20 is fetched from the collector of the transistor 21 (via a terminal OUT) and fed to an amplifier at the following stage. Moreover, the base of the transistor 22 receives a negative feedback signal (voltage) from the output at the following stage of the main amplifier via a low-pass filter 29. The low-pass filter 29 is an integral circuit having a resistor RNF, a capacitor CNF and a resistor RF.

The muting circuit used in the amplifier circuit of this sort normally utilizes the capacitor CNF of the low-pass filter 29 and combines with a precharge circuit 33 relative to the capacitor CNF. For the precharge circuit 33, a switch circuit is normally employed. With these circuits described above, the main amplifier is placed in a mute state by inhibiting the amplifier from being amplified when the power supply is turned on.

A mute signal is produced by holding on the switch circuit of the precharge circuit 33 for a predetermined period of time in response to the power supply "on" signal. This mute signal causes the capacitor CNF to be charged by receiving current from the power line +Vcc via the precharge circuit 33. FIG. 3(b) shows a change of voltage as the capacitor CNF is charged.

As shown in FIG. 3(b), the capacitor CNF is first precharged by the precharge circuit 33 (switch circuit) that is held "on" at the initial "on" stage of the power supply. Consequently, the voltage rises as the supply voltage rises. The charging voltage simultaneously becomes the base voltage Vb (Vb in the graph of FIG. 3(b)) of the transistors 22. In FIG. 3(b), the constant voltage supplied to the power line +Vcc is represented by Vcc.

The base voltage Vb of the transistor 22 is maintained by precharging at a level higher than the base voltage VIN of the transistor 21 on the input side (voltage VIN is set at a preset operating point). Then the transistor 22 is held in the "off" state, whereby the input signal is cut or attenuated by several tens of dB. The signal amplifying operation of the main amplifier is therefore suspended or inhibited. As a result, the main amplifier is placed in the mute state.

The switch circuit of the precharge circuit 33 is turned off after the capacitor CNF has been precharged for the predetermined period of time. The capacitor CNF then starts to discharge the voltage and therefore the charge is gradually discharged. The discharge voltage is equal to the voltage at the base Vb of the transistor 22. When the discharge voltage becomes substantially equal to the voltage VIN on the input side, the mute state is released, so that the differential amplifier circuit 20 is in an operating condition.

In such a muting circuit, the mute time is determined by the precharge and discharge periods of the capacitor CNF. For this reason, the muting period after the power supply is turned on becomes excessively long if the precharge voltage is set too high. Consequently, one might choose not to set the precharge voltage very high. However, when a pop noise exceeding the precharge voltage is added to the input side, the mute is not effective and this allows the pop sound to flow from the speaker via the main amplifier.

If the precharge voltage is raised to obviate the shortcoming described above, the mute time becomes too long to make difficult the selection of a proper condition. As shown by dotted lines, moreover, the precharge voltage changes as the supply voltage fluctuates. The problem in this case is that the mute time changes.

SUMMARY OF THE INVENTION

An audio amplifier circuit according to the present invention features an arrangement of a power line with a smoothing capacitor inserted therein as a power filter and a power line without such a smoothing capacitor. The audio amplifier circuit in which an input stage amplifier of a main amplifier is supplied with power via the former power line has a muting circuit for rapidly charging a negative feedback capacitor for generating negative feedback voltage to be fed back from the following stage of the main amplifier to the input stage amplifier up to a voltage level at which a pop sound is inhibited when the power is supplied and for rapidly discharging the negative feedback capacitor up to a reference operating voltage level when the voltage of the former power line with the smoothing capacitor inserted therein exceeds a predetermined level, the voltage of the former power line being monitored after the power is supplied from a power supply.

In this way, the negative feedback capacitor connected to the input stage amplifier of the main amplifier is caused to perform a muting operation by rapidly charging the capacitor up to a level higher than a pop sound level. A point of time at which the muting operation terminates is determined by a point of time at which the negative feedback capacitor is caused to start to discharge itself by rapidly discharging the negative feedback capacitor. If the point of time at which the negative feedback capacitor starts to discharge itself is determined by detecting the voltage of the smoothing capacitor, that is, by detecting the voltage of its power line, the timing determination will be set free from fluctuation.

The reason for this is that the smoothing capacitor has a relatively large capacitance and consequently charges at a relative slow rate. Almost every smoothing capacitor is charged at a voltage dividing resistance ratio for dividing the voltage between the supply voltage generated in the unsmoothed power line and the ground. As a result, a rise curve of the charging voltage becomes slackened. Even though the supply voltage slightly fluctuates, a positional shift in terms of time is less when a desired voltage is detected.

If it is thus detected that the charging voltage of the smoothing capacitor has reached a predetermined value, the detection timing is not greatly affected by the fluctuation of the supply voltage. As the negative feedback capacitor which starts to discharge itself at the detection timing is rapidly discharged, it remains unaffected by the charging voltage value. As the negative feedback capacitor is rapidly charged, further, the charging time and charging voltage fluctuate less.

Consequently, a greater negative feedback voltage can be set in the negative feedback capacitor when the muting operation is started simultaneously with the supply of the power. A transient shock pulse which will cause a pop sound is arrested by the high negative feedback voltage set in the negative feedback capacitor, provided the voltage of the negative feedback capacitor is set at a value large enough to prevent the pop sound from being produced. Moreover, the shock pulse exceeding the negative feedback voltage and causing the pop sound and the like to be produced is not transmitted to the output stage of the main amplifier. The main amplifier is thus muted for the duration required for muting.

An object of the present invention is therefore to provide an audio amplifier circuit capable of almost entirely arresting a pop sound and the like when power is supplied.

Another object of the present invention is to provide an audio amplifier circuit having a muting circuit capable of securing a proper muting time even though the supply voltage fluctuates.

Still another object of the present invention is to provide an audio amplifier circuit equipped with a muting circuit fit for circuit integration in audio equipment having a stand-by switch function.

BRIEF DESCRIPTION OF THE DRAWINGS

FIG. 2 is a waveform chart illustrating the operation of a muting circuit in the audio amplifier circuit of FIG. 1.

FIG. 3(*a*) is a block diagram illustrating a conventional muting circuit attached to a main amplifier.

FIG. 3(*b*) is a waveform chart illustrating the operation of the muting circuit of FIG. 3(*a*).

DESCRIPTION OF THE PREFERRED EMBODIMENT

Figure 1:
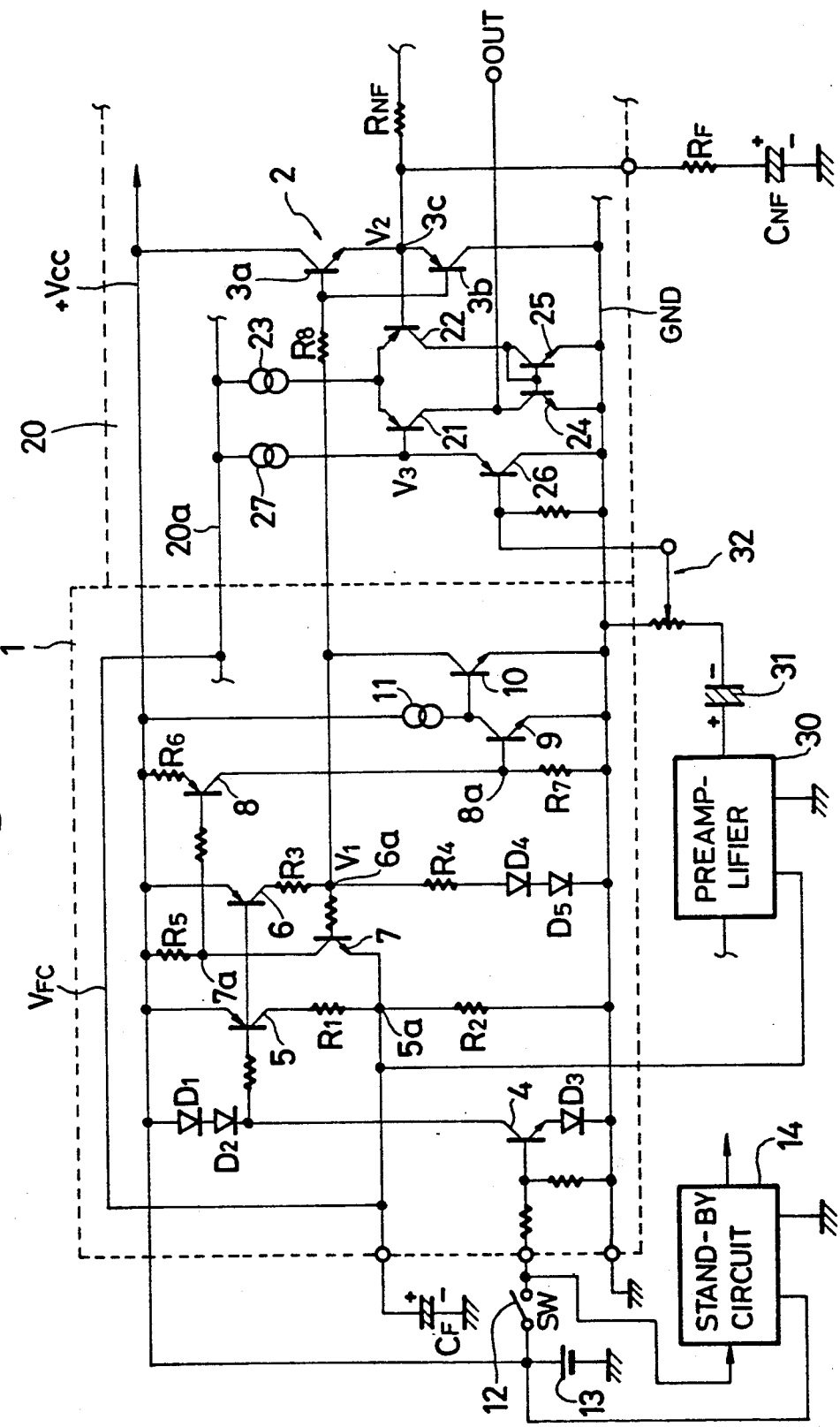
FIG. 1 is a block diagram illustrating an audio amplifier circuit embodying the present invention applied to audio equipment with an input stage amplifier of a main amplifier as a central figure.

As shown in FIG. 1, a muting signal generator circuit 1 and a switch circuit 2 which will be described later constitute a muting circuit. A switch 12 is used for turning on/off a power supply as viewed from the outside and functions as a stand-by switch within the circuit. Numeral 20 represents a differential amplifier circuit at the initial stage of a main amplifier. A power line 20*a* of the differential amplifier circuit 20 is connected to a power line VFc. A smoothing capacitor CF which functions as a power filter is inserted in between the power line VFc and a ground line (GND) to generate a smoothed supply voltage.

The switch circuit 2 is used for controlling the charging and discharging of a negative feedback capacitor CNF connected to the base of a transistor 22. The switch circuit 2 consists of an NPN transistor 3*a* whose collector is connected to a power line +Vcc and a PNP transistor 3*b* connected to, and located on the downstream side of, the NPN transistor 3*a*. The emitter of the PNP transistor 3*b* is connected to the emitter of the transistor 3*a*, whereas the collector of the transistor 3*b* is connected to the ground line GND. The contact point 3*c* between the transistor 3*a* and the transistor 3*b* is connected to a negative feedback DC voltage generator terminal of the capacitor CNF. Further, the bases of the transistors 3*a*, 3*b* are connected to a common resistor $R_8$ and receive a mute signal from the muting signal generator circuit 1 via the resistor $R_8$.

Before operating, the muting signal generator circuit 1 receives a stand-by signal obtained from a power supply 13 via the stand-by switch 12 when the stand-by switch 12 is turned on.

The latest audio equipment such as radio cassette recorders and the like are provided with various additional functions, including displaying an identification code of time for starting or stopping recording at the predetermined time set in accordance with operations from the outside, and automatic telephone answering. The power line +Vcc and the power supply 13 are directly connected, so that the supply voltage is applied to the circuits for performing those functions at all times. Moreover, the stand-by switch is adapted for use as an operational power switch in the audio equipment of that sort.

In the circuit shown in FIG. 1, the stand-by switch 12 is also used as an operational power switch and when the switch is operated, the power supply is turned on, whereby the whole audio amplifier circuit including the main amplifier is turned on separately from any circuit having a special function. As shown in FIG. 2, the power line +Vcc always maintains supply voltage at a predetermined level, irrespective of the "on/off" state of the power supply ("on/off" state of the stand-by switch 12).

In the main amplifier of the audio amplifier circuit of the sort described above (particularly in the power amplifier) and the like, voltage Vcc is normally applied from the power line +Vcc. On the other hand, other signal processing circuits such as a preamplifier and the like are supplied with power at the smoothed voltage from the power line VFc. The circuit to be supplied with power directly from the power line +Vcc is normally supplied with an operating signal from a stand-by circuit 14 according to an "on" signal from the stand-by switch 12. In other words, the audio amplifier circuit of this sort is kept in a stand-by state in which the voltage of the power line +Vcc is normally applied thereto. When the stand-by switch 12 is actuated, every circuit involved starts to operate.

The voltage Vcc is normally applied from the power line +Vcc to the muting signal generator circuit 1. On receiving the signal at the base of a transistor 4 from the stand-by switch 12, the muting signal generator circuit 1 operates. The transistor 4 is an NPN transistor and, with diodes $D_1$, $D_2$ on its collector side as loads, is connected via these diodes to the power line +Vcc. The collector output of the transistor 4 is applied to the bases or PNP transistors 5, 6. When the transistor 4 is turned on, the transistors 5, 6 are turned on accordingly. The emitter of the transistor 4 is grounded via a diode D. for level shifting.

The transistor 5 and voltage divider resistors $R_1$, $R_2$ constitute a divided voltage generator circuit, whereas the transistor 6 and voltage divider resistors $R_3$, $R_4$ also constitute a divided voltage generator circuit. The emitter of the transistor 5 is connected to the power line +Vcc and the collector thereof is grounded via the voltage divider resistors $R_1$, $R_2$ connected thereto in series. The emitter of the transistor 6 is connected to the power line +Vcc and the collector thereof is grounded via the voltage divider resistors $R_3$, $R_4$ connected thereto in series and level shifting diodes $D_4$, $D_5$. When the transistors 5, 6 are turned on, voltages for dividing the supply voltage Vcc appear at the respective contact points of the divider resistors.

An NPN transistor 7, together with the transistor 5, is inserted in between the power line +Vcc and the power line VFc, these transistors 5, 7 constituting a switch circuit. When the stand-by switch 12 is turned on, that is, when the operation of supplying power is performed, the transistors 5, 7 are turned on so as to supply power from the power line +Vcc to the power line VFc. The transistor 7 also functions as a detection circuit for detecting the stop time of the mute signal. The collector of the transistor 7 is connected via a load resistor $R_5$ to the power line +Vcc and the base thereof is connected via a current limiter resistor to the voltage dividing point 6a set by the voltage divider resistors $R_3$, $R_4$. The emitter of the transistor is connected to the voltage dividing point 5a set by the voltage divider resistors $R_1$, $R_2$. The voltage dividing point 5a is connected to a terminal (which is not grounded) of the capacitor CF of the power filter. The voltage dividing point 6a is used as an output terminal of the mute signal and is connected to a resistor $R_8$ connected to the base of the switch circuit 2.

A circuit constructed of a PNP transistor 8 and NPN transistors 9, 10 is controlled by the output signal of the transistor 7 for detecting the stop timing of the mute signal so as to stop the mute signal. The base of the transistor 8 is connected to the contact point 7a between the resistor $R_5$ and the collector of the transistor 7. The emitter of the transistor 8 is connected via a resistor $R_6$ to the power line +Vcc and the collector thereof is grounded via a resistor $R_7$ as its load. The base of the transistor 9 is connected to the contact point 8a between the resistor $R_7$ and the transistor 8.

When the transistor 7 is turned on, a signal produced at the terminal 7a of the resistor $R_5$ and used for detecting the "on" state of the power supply is applied via the transistor 8 to the transistor 9. The emitter of the transistor 9 is grounded and the collector thereof is connected via a constant current source 11 to the power line +Vcc and further to the base of the transistor 10. When the power supply is turned on, the transistor 9 is also turned on. The collector output of the transistor 9 is applied to the transistor 10. The emitter of the transistor 10 is grounded and the collector thereof is connected to the voltage dividing point 6a. Consequently, the "on/off" state of the transistor 10 is rendered opposite in operation to that of the transistor 9. At a point of time the power is supplied, the transistor 10 remains "off." When the transistor 10 is turned on, the voltage dividing point 6a is drawn close to ground potential, whereby the generation of the mute signal is forced to stop.

The operation of the muting signal generator circuit 1 will be described with reference to FIG. 2. When power is supplied, the stand-by switch 12 becomes actuated. Simultaneously, the transistors 4, 5, 6 are turned on. On receiving a predetermined bias voltage from the voltage dividing points 5a, 6a, the transistor 7 becomes actuated. When the transistor 7 is turned on, the voltage at the terminal 7a drops from the voltage Vcc, so that the transistor 8 is turned on. When the transistor 8 is turned on, a voltage is generated at the terminal 8a and the transistor 9 is turned on. As a result, the transistor 10 is held "off" and voltage $V_1$ at the voltage dividing point 6a conforms to what is given by the following equation:

$$V_1 = r_4 \cdot (Vcc - 2\ Vfn) / (r_3 + r_4)$$

where Vcc=voltage of power line +Vcc; Vfn= forward voltage drop between the base and emitter of the NPN transistor 9, which is similar to that between the diodes $D_4$, $D_5$; and $r_3$, $r_4$=resistance values of respective resistors $R_3$, $R_4$.

As shown in FIG. 2, the voltage $V_1$ at the voltage dividing point 6a at the time the power is supplied according to the equation above is divided by the resistors $R_3$, $R_4$ and becomes a voltage slightly lower than the Vcc (corresponding to when the transistor 3a on). This is a mute signal.

When the mute signal at that voltage $V_1$ is applied via the resistor $R_8$ to the switch circuit 2, the transistor 3a in the switch circuit 2 is turned on and the capacitor CNF is rapidly charged. As a result, a voltage $V_2$ is generated at the terminal of the capacitor CNF (see $V_2$ of FIG. 2). Simultaneously, the power line +Vcc starts to charge the capacitor CF via the resistor $R_5$ and the transistor 7 at the time the power supply is turned on. VF in FIG. 2 shows this charging voltage.

When the voltage VF rises and exceeds $V_1-Vfn$, the voltage between the base and emitter of the transistor 7 decreases to 1Vfn or lower than 1Vfn, whereby the transistor 7 is held "off". The transistor 8 is turned off thereby and further the transistor 9 is also turned off. Consequently, the transistor 10 is held "on" and the voltage $V_1$ at the voltage dividing point 6a drops close to the ground potential, thus stopping the mute signal. Then the transistor 3a in the switch circuit 2 is turned off, whereas the transistor 3b is turned on. The capacitor CNF is thus rapidly discharged.

The discharge of the capacitor CNF makes its voltage $V_2$;

$$V_2 = Vsat_{10} + Vfn + Ib \cdot r_8$$

The voltage $V_1$ at the voltage dividing point 6a becomes $Vsat_{10}$.

However, $Vsat_{10}$=saturation voltage of the transistor 10; Ib =current flowing through the resistor $R_8$; and $r_8$=resistance of the resistor $R_8$.

As the base of a transistor 26 is close to ground potential, the base voltage $V_3$ of a transistor 21 substantially becomes slightly higher than Vfp (VFP is the forward voltage drop between the base and emitter of the PNP transistor 21). Given that the voltage in the normal state of the base of the transistor 22 is Vr, $V_2=V_3(=Vr)$ after the suspension of the mute signal and the differential amplifier circuit 20 at the input stage operates with the voltage Vr as a reference after the capacitor CNF at the base of the transistor 22 has been discharged and amplifies the signal in the range of voltage levels between Vfn and Vfp. The operation of the amplifier circuit 20 remains unaffected by the switch circuit 2 thereafter. The voltage Vr is also a reference negative feedback voltage while the main amplifier is in an operating state.

Although a description has been given of this embodiment in operation, the voltage $V_2$ after the transistor 22 has been discharged may be set freely by inserting resistors, level shifting diodes and the like on the emitter or collector side of the transistor in the switch circuit 2. Moreover, it is also possible to change the voltage $V_2$ by inserting resistors, level shifting diodes and the like in the transistor circuit 10. Further, the voltage $V_2$ may be set independently of the voltage $V_1$ in conformity with the requirements on designing the switch circuit. Consequently, the voltages $V_1$, $V_2$ according to the present invention are not limited to those set values related to each other as described in the embodiment shown. Similarly, the range of operation of the differential amplifier circuit 20 may be set greater by the order of 1 Vfn or 1 Vfp, provided the input signal is subjected to level shifting by inserting level shifting diodes and the like into the differential amplifier circuit 20. In other words, the range of operation of the differential amplifier circuit 20 is not limited to a voltage range of upper 1 Vfn to lower 1 Vfp.

Although the voltage $V_1$ applied to the base of the transistor 7 has been defined to cause the switch circuit 2 to be turned on/off the switch circuit on/off voltage, they may be generated independently.

Although the description given in the embodiment shown has centered upon the audio amplifier circuit equipped with the stand-by switch, it is only necessary for the negative feedback voltage toward the input stage of the main amplifier to be higher than what causes a pop sound before the input stage enters into operation. If this embodiment is viewed from the angle above, the capacitor CFN is rapidly charged and its voltage becomes higher than the voltage of the power line VFc before it reaches the operating level at the input stage as the differential amplifier circuit at the input stage is supplied with the power from the power line VFc according to the embodiment. The stand-by switch is irrelevant to the operation in this invention. In other words, provided there exist the power line VFc with the smoothing capacitor and the power line +Vcc without being smoothed by the capacitor, the stand-by switch may be installed according to the present invention on condition that the input stage of the main amplifier is supplied with power from the former power line VFc.

The grounding in the embodiment shown may be implemented with the potential line as a so-called reference one.

Incidentally, the same effect may be achieved even though the circuitry used in the embodiment shown is formed in such a way that the NPN transistors are replaced with the PNP type and vice versa. Although a positive voltage has been used as the power supply voltage, moreover, it may be replaced with a negative voltage. In this case, the voltage of the smoothing capacitor for detecting the point of time the discharge is started should be equal to or lower than a predetermined voltage.

We claim:

1. An audio amplifier circuit for processing an audio signal, said audio amplifier circuit having a first power line with a smoothing capacitor inserted therein and a second power line; and an input stage amplifier of a main amplifier for amplifying the audio signal, said input stage amplifier being supplied with power from said first power line; said audio amplifier circuit comprising:

a feedback capacitor for generating a feedback voltage to be fed back from said main amplifier to said input stage amplifier, and a muting circuit for rapidly charging said feedback capacitor up to a first voltage level when power is supplied to said second power line and for rapidly discharging said feedback capacitor up to a reference operating voltage level when a voltage of said smoothing capacitor is not lower than a second voltage level by detecting the voltage of said smoothing capacitor, such that a pop sound is inhibited from being added to said audio signal.

2. An audio amplifier circuit including a main amplifier for amplifying an audio signal, said main amplifier comprises an input stage which is supplied with power from a first power line whose voltage is stabilized by a first capacitor, a second capacitor for supplying a feedback voltage to said input stage amplifier on receiving a signal from said main amplifier, and a muting circuit to be supplied with power from a second power line without a voltage smoothing capacitor, wherein:

said muting circuit includes means to rapidly charge said second capacitor in response to an operation of supplying power to said second power line until a charge voltage stops said input stage amplifier from amplifying said audio signal so that a pop sound is substantially prevented from being added to said audio signal, and means to detect whether the voltage of said first power line exceeds a predetermined value in order to rapidly discharge the charge of said second capacitor until the charged voltage thereof decreases up to a reference operating voltage with respect to said input stage amplifier.

3. An audio amplifier circuit including a first power line, a second power line for supplying power to said first power line in compliance with an operation of supplying power, a smoothing capacitor inserted in between said first power line and a reference potential line to stabilize a voltage of said first power line, a main amplifier for processing an audio signal, said main amplifier having an input stage amplifier for receiving power from said first power line, a feedback capacitor for supplying a feedback voltage to said input stage amplifier on receiving a feedback signal from said main amplifier, and a muting circuit for receiving power from said second power line without a voltage smoothing capacitor wherein:

said muting circuit includes means to rapidly charge said feedback capacitor by means of current from said second power line in response to the operation of supplying power for placing said main amplifier in a muting state until a charge voltage stops said input stage amplifier from amplifying said audio signal so that a pop sound is substantially prevented from being added to the audio signal, and means to detect whether the voltage of said first power line exceeds a predetermined value in order to rapidly discharge the charge of said feedback capacitor until he charged voltage thereof decreases up to a reference operating voltage with respect to said input stage amplifier, so taht the muting state of said main amplifier is cancelled at a predetermined period after the operation of supplying power is performed.

4. An audio amplifier circuit as claimed in claim 3, wherein said muting circuit comprises a first and a second switch circuit, wherein said first switch circuit is inserted in between a terminal on a feedback voltage generating side of said feedback capacitor and said second power line, a charge current being supplied from said second power line to said feedback capacitor, and wherein said second switch circuit is inserted in between said terminal and said reference potential line in order to discharge the charge of said feedback capacitor.

5. An audio amplifier circuit as claimed in claim 4, wherein said muting circuit is a control circuit which operates to turn on said first switch circuit in response to the operation of supplying power to place said main amplifier in the muting state and to turn off said first switch circuit and to turn on said second switch circuit on detecting that a voltage of said second power line exceeds a predetermined value.

6. An audio amplifier circuit as claimed in claim 5, wherein said second power line is normally supplied with supply voltage and wherein said operation of supply power is performed via a stand-by switch.

7. An audio amplifier circuit as claimed in claim 6, wherein said muting circuit has a third and a fourth switch circuit inserted in between said second and said first power lines, respectively, wherein said stand-by switch is operated as the operation of supplying power is performed, said third and said fourth switch circuit being turned on, so that power is supplied from said second power line to said first power line, wherein when the voltage of said first power line exceeds a predetermined value, said fourth switch circuit is turned off, and wherein an on/off operation of said fourth switch circuit corresponds to an on/off operation of said first switch circuit, and an on/off operation of said second switch circuit is reversed.

8. An audio amplifier circuit as claimed in claim 7, wherein said fourth switch circuit is a transistor circuit including a transistor having its emitter connected to said first power line, and its base connected to a predetermined bias voltage point.

9. An audio amplifier circuit as claimed in claim 8, wherein the input stage of said main amplifier is a differential amplifier circuit having a first input for receiving an input signal and a second input, and the second input receives voltage from the terminal on the feedback voltage generating side of said feedback capacitor.

10. An audio amplifier circuit as claimed in claim 9, further comprising a stand-by circuit which operates in compliance with the operation of supplying power in said stand-by switch and causes an output stage of said main amplifier to operate, and wherein said output stage of said main amplifier is supplied with power from said second power line.

11. An audio amplifier circuit having a first power line with a smoothing capacitor inserted therein and a second power line, and an input stage amplifier of a main amplifier for processing an audio signal, said input stage amplifier being supplied with power from said first power line, comprising:

a feedback capacitor for generating a feedback DC voltage to be fed back from said main amplifier to said input stage amplifier, and a muting circuit for rapidly charging said feedback capacitor up to a voltage level at which a pop sound is inhibited from being added to the audio signal when power is supplied to said second power line and for rapidly discharging said feedback capacitor up to a reference operating voltage level when a voltage of said smoothing capacitor is not lower than a predetermined voltage level by detecting the voltage of said smoothing capacitor.

12. An audio amplifier circuit having a first power line with a smoothing capacitor inserted therein and a second power line and an input stage amplifier of a main amplifier for processing an audio signal, said input stage amplifier being supplied with power from said first power line, comprising:

a feedback capacitor for generating a feedback DC voltage to be fed back from said main amplifier to said input stage amplifier, and muting circuit for rapidly charging said feedback capacitor up to a voltage level at which a pop sound is inhibited form being added to said audio signal when power is supplied to said second power line and for rapidly discharging said feedback capacitor up to a reference operating voltage level when a voltage of said smoothing capacitor is not higher than a predetermined voltage level by detecting the voltage of said smoothing capacitor.

* * * * *